United States Patent [19]

Wouda et al.

[11] Patent Number: 4,786,884
[45] Date of Patent: Nov. 22, 1988

[54] ADAPTIVE TRANSVERSAL FILTER

[75] Inventors: Kornelis J. Wouda; Simon J. M. Tol, both of Eindhoven, Netherlands

[73] Assignee: AT&T Philips Telecommunications B.V., Hilversum, Netherlands

[21] Appl. No.: 28,631

[22] Filed: Mar. 20, 1987

[30] Foreign Application Priority Data

Mar. 28, 1986 [NL] Netherlands ............ 8600816

[51] Int. Cl.$^4$ .............................. H03H 15/00
[52] U.S. Cl. ........................ 333/166; 379/411
[58] Field of Search .............. 333/166, 18; 364/824, 364/825, 724; 379/406, 410, 411; 328/167

[56] References Cited

U.S. PATENT DOCUMENTS

| | | | |
|---|---|---|---|
| 3,588,385 | 6/1971 | Moyer | 364/824 X |
| 4,403,245 | 9/1983 | Wischermann | 333/166 X |
| 4,431,976 | 2/1984 | Voorman | 333/166 |
| 4,476,539 | 10/1984 | Tamori et al. | 364/825 |

FOREIGN PATENT DOCUMENTS

| | | | |
|---|---|---|---|
| 2060159 | 6/1972 | Fed. Rep. of Germany | 333/166 |
| 0153821 | 11/1981 | Japan | 333/166 |

Primary Examiner—Eugene R. LaRoche
Assistant Examiner—Benny Lee
Attorney, Agent, or Firm—Lucian C. Canepa

[57] ABSTRACT

Adaptive transversal filter for use with three-signal level signals, arranged to cancel shifts in the two extreme signal levels relative to the central signal level, information signaling whether the signal level is the central signal level being coupled to first delay means (2) having N+1 connecting terminals, and information signaling whether the signal level is either one or the other extreme signal level being coupled to second delay means (4) having N+1 connecting terminals and comprising first and second coefficient registers ($C_{O0}$–$C_{ON}$; $C_O$–$C_{sN}$) each containing N+1 coefficients; means (8, 9) for always multiplying one of the coefficients by an associated connecting terminal signal of the delay means, means (10) for adding together all the multiplying results obtained for providing a cancellation signal and means for always blocking the signal from a connecting terminal of the second delay means when this signal represents neither the one nor the other extreme signal level.

5 Claims, 1 Drawing Sheet

ADAPTIVE TRANSVERSAL FILTER

BACKGROUND OF THE INVENTION

The invention relates to an adaptive transversal filter having an input for receiving a time-discrete input signal which is representative of three signal levels, first and second delay means for producing delayed versions of each time-discrete input signal, first and second coefficient registers, the first and second coefficient registers for the non-delayed and each delayed version of the input signal containing a specific coefficient of the respective first and second delay means; means for multiplying always one of the coefficients by the associated version of the input signals and means for adding together all the multiplying results obtained to provide a cancellation signal.

Such an adaptive transversal filter, used as a component part of an echo canceller, is described in O. Agazzi et al.: "Non linear echo cancellation of data signals"; IEEE Transactions on Communications, Vol. COM-30, No. 11, November 1982, pages 2421-2433.

In digital transmission via a two-wire link, adaptive transversal filters are used to cancel to the best possible extent in the received signal the echo signal of its own transmitter. Often this echo signal is significantly stronger than the received signal and without adequate echo cancellation an errorless detection of the received signal is not possible. The transversal filter constructs the echo cancellation signal from a linear combination of the most recently transmitted symbol and the N symbols transmitted previous thereto, N being independent of the time during which an own, transmitted symbol still affects the received signal. For each of the N+1 symbols the transversal filter contains its own coefficient in a coefficient register and the contribution of a signal to the echo signal is calculated by multiplying for each symbol the associated coefficient by the symbol level, for example +1, 0 or −1 in the case of a three-level signal.

Transversal filters are not only used for forming an echo cancellation signal, but they are alternatively suitable for use for other cancelling purposes, for example in adaptive decision feedback equalization. For a description thereof reference is made to K. J. Wouda: "An implementation of a 144 kbit/s transmission system for two wire loops"; Trends in telecommunications Vol 1, No 1, pages 55-66.

In order to make it possible to continuously optimize the coefficients in the transversal filter, a transversal filter can be coupled in a manner known per se to an adaptive control loop. For a description of the adaptive control of the coefficients in a transversal filter reference can be made to N. A. M. Verhoeckx et al: "Digital echo cancellation for base band data transmission"; IEEE Transactions ASSP, Vol ASSP-27, No. 6, December 1979, pages 768-781.

For the adaptive transversal filter described in said article by Agazzi et al, efforts are made to offer a solution for the problem that in a transmitter when signals of three or more levels are used, the position of the levels relative to the zero level can only be made equidistantly with a limited degree of accuracy. If, for example, for three-level signals the +1 level has, relative to the 0-level, an amplitude which deviates from that of the −1 level relative to the 0-level, then, in a conventional adaptive transversal filter a product will be produced on multiplication by a predetermined coefficient for a previously transmitted symbol which for a −1 symbol differs from that for a +1 symbol, which results in unwanted residual errors in the echo cancellation signal.

In the adaptive transversal filter proposed by Agazzi et al, this problem is mitigated in that the transversal filter is constructed as a binary transversal filter, the binary signals which represent the send signal levels being directly applied to the delay means in the transversal filter and for each of the binary signals or signal combinations representing a send level, delay means are provided in the form of an N-bit shift register. Associated with each shift register is a coefficient register in which a coefficient is stored for each output signal of that shift register. After multiplication of all the output signals of the shift registers by the associated coefficients, all the multiplying signals are added together to obtain the echo cancellation signal. As each of the signal levels is cancelled thus via its own shift register and its own coefficient register, also signal level differences can be compensated for. The adaptive control loop then ensures an appropriate setting of the coefficients by which the different signal levels are to be multiplied to accomplish that the echo cancellation signal is such that the sum of the echo signal and the echo cancellation signal approximates the zero signal level to the best possible extent. A drawback of the prior art binary adaptive transversal filter is that, for example for three-level signalling, each of the coefficients in the coefficient register must in principle be able to assume a value which corresponds to the full amplitude of the send signal, which requires a great deal of storage capacity and consequently a large chip surface area when realized in integrated circuit techniques.

SUMMARY OF THE INVENTION

The present invention has for its object to provide a solution which requires less storage capacity for storing the coefficient values and by means of which an optimum cancellation is achieved faster in the case in which the +1 send level differs from the −1 send level.

For that purpose, the invention provides an adaptive transversal filter of said type, characterized in that the first delay means contains M delayed versions of each time-discrete signal and the first coefficient register contains M+1 coefficients, that the second delay means contains N delayed versions of each time-discrete signal and the second coefficient register contains N+1 coefficients, wherein M<N and that information representing the central signal level is applied to the first delay means, that information representing one or the other extreme signal level is applied to the second delay means, in addition means being provided for only applying summed multiplication results obtained with the aid of the first delay means to an output when the information present which signals the presence of the central signal level is applied to the first delay means.

The present invention is based on the recognition that an optimum cancellation of the +1 and the −1 signal levels is possible using only one coefficient register whose coefficients can assume a value which corresponds to the full amplitude of the send level, when in addition thereto a coefficient register is provided for shifting the zero level such that it becomes located symmetrically between the +1 and −1 send level signals. For obtaining such a shift in the zero level a coefficient register is sufficient whose number of coefficients M can be less than N and the coefficients need only to pass through a limited amplitude range since the required shift in the zero level, with the object of positioning it symmetrically between the +1 and −1 send levels, generally is less than 5% of the send level amplitude. Consequently, for the coefficient register for the send level zero only a small storage capacity is required and consequently only little chip surface area.

The storage capacity required for the coefficient register for the transmit level zero can alternatively be further reduced in the case in which M=N, more specifically by storing for the coefficients of symbols transmitted some period of time in the past, for example more than P symbols ago, where P<N, a fixed coefficient value equal to zero in the register. The influence of asymmetry of the +1 and −1 level relative to the zero level becomes namely less important according as it relates to symbols which were transmitted a longer period of time in the past. The contribution of these symbols to the overall echo signal to be cancelled is indeed already low, so that the influence of said asymmetry on the echo component to be cancelled can be disregarded. By storing coefficient values equal to zero the required memory capacity is reduced and the cancellation signals for shift in the zero level are suppressed.

As has already been mentioned in the foregoing, it is alternatively possible, in connection with the above-described phenomenon, to choose, instead of first delay means each having an equal number of terminals, the number of connecting terminals M of the first delay means which indicate the presence of the zero level, to be less than N, whilst it is then also possible to reduce the length of the coefficients of the first coefficient register in a corresponding way. In such a case it is indeed necessary to provide means which prevent delayed signals of the second delay means which do not have corresponding delayed signals of the first delay means from carrying weight in the sum signal for the case in which those signals are not representative of the +1 or −1 transmit level, since the transmit level zero is present. A manner of realizing such means can, for example, be realized by applying the entire overall ternary signal to the second delay means and to store in the coefficient registers for the values of the extreme signal levels a zero as a result of which the contribution of the second delay means to the sum signal is zero at the instant at which the contribution of the first delay means corresponds to the central signal level.

It has been found that the adaptive transversal filter according to the invention can be accommodated on a chip surface area which is approximately 10% smaller than for the prior art filter. The additionally required logic circuits necessary to enable operation of the filter according to the invention require a comparatively small chip surface. It will be obvious for persons skilled in the art that a gain of 10% in the required chip surface does not only reduce the cost price of the integrated circuit containing the filter, but also reduces the number of rejects of chips during production. A further advantage of the filter according to the invention is that the adaptive control loop, as will be explained in greater detail hereinafter, furnishes the appropriate cancellation signal faster than the prior art filter.

Although in the description a zero level and a +1 and a −1 transmit signal level are always mentioned, the invention is also applicable to any other type of three-level signal having a central and two extreme transmit signal levels.

BRIEF DESCRIPTION OF THE DRAWING

The advantages of the invention and how it can be put into effect will now be further described by way of example with reference to an embodiment shown in the accompanying drawing; wherein.

DETAILED DESCRIPTION

Figure 1:
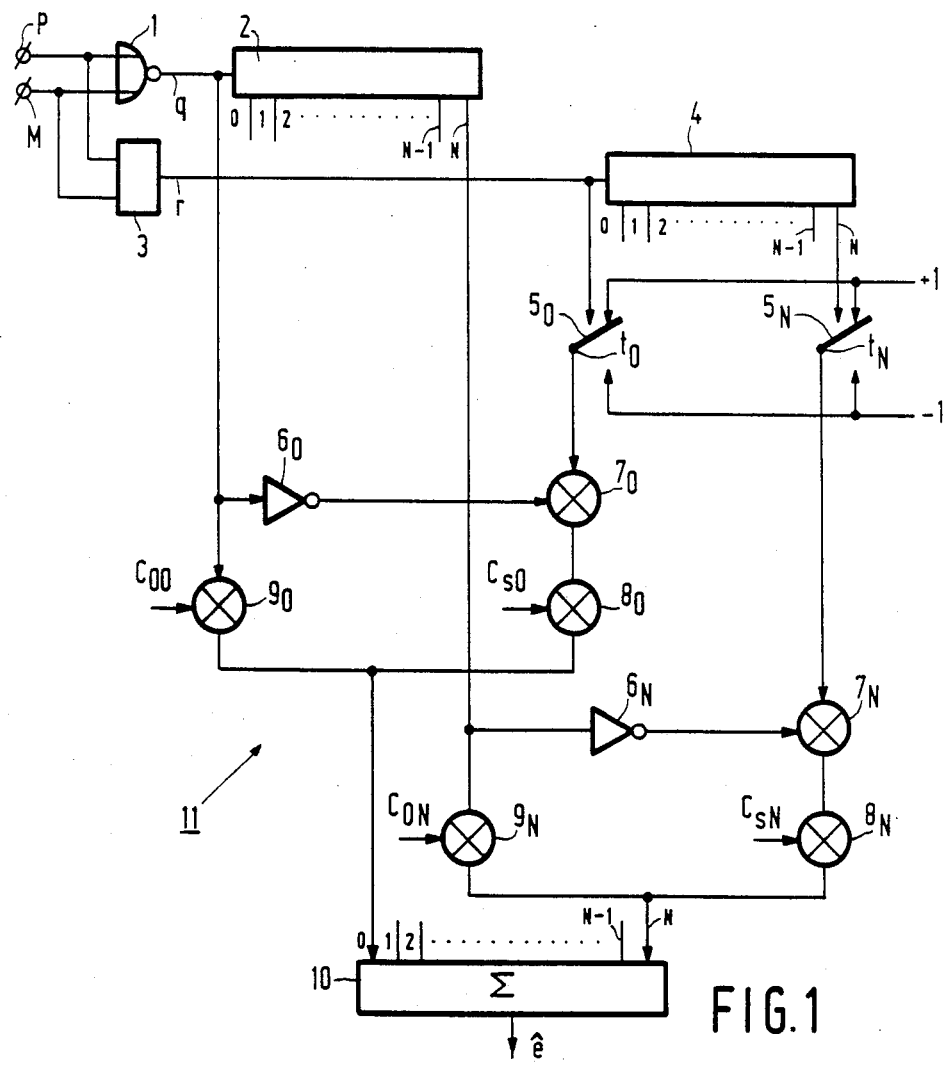
FIG. 1 shows a block circuit diagram of a conceptual structure of a transversal filter according to the invention.

In connection with the embodiment shown in FIG. 1, it should be noted for the sake of completeness, that numerous different implementations of this conceptual structure for a transversal filter are possible FIG. 1 shows a transversal filter realized with, the aid of shift registers 2 and 4 with an equal number of sections (N=M) for the first and second delay means, which filter in general is denoted by reference numeral 11, of which only the section for the instantaneously transmitted signal, and the $N^{th}$ section, for the signal transmitted N transmit periods earlier, are shown in their totality, as the intermediate sections are identical to the sections shown.

Binary signals are applied to the filter via two signal leads p and m. These binary signals represent, according to the following Table 1, three transmit signal levels 5.

TABLE 1

| s | pm |
|---|-----|
| + | 10 |
| 0 | 00 |
| − | 01 |

The signals on the leads p and m are coupled to the respective two inputs of a NOR-gate 1 and to the two inputs of a logic circuit 3. The output signals q and r of gate 1 and logic circuit 3, respectively, are linked, as is shown in the respective Tables 2 and 3 following hereinafter, with the signals on the leads p and m.

TABLE 2

| pm | q |
|----|---|
| 10 | 0 |
| 00 | 1 |
| 01 | 0 |

TABLE 3

| pm | r |
|----|---|
| 10 | 1 |
| 00 | — |
| 01 | 0 |

The signal q indicates whether the binary signal is representative or not representative of the transmit level zero. If the transmit level is zero, an 1 is entered into the N-bit shift register 2 and, in the opposite case, a 0.

The signal r indicates whether the binary signal is representative of the transmit level +1 or of the transmit level −1. In the first-mentioned case an 1 is entered into the N-bit shift register 4, and a 0 in the opposite case. The input signal and the output signals of the shift register 4 control switches $5_0-5_N$, the sliding contact being connected, for a binary signal 1, to a conductor carrying a signal which corresponds to the transmit signal level +1 and for a binary signal 0 to a conductor carrying a signal which corresponds to the transmit signal level −1. Thus, the fixed contact of the switch $5_0$ carries a voltage having the signal level +1 when the output voltage r of circuit 3 was a 1 and a signal level −1 when the output voltage r of circuit 3 was a 0. The same applies to the switches $5_1-5_N$ for the signal r during the preceding N symbols. The signals on the fixed contacts of the switches $5_0-5_N$ are coupled to the respective inputs of the multiplying circuits $7_0-7_N$.

The input signal and the output signals of the shift register 2 are always coupled via respective inverters $6_0-6_N$ to the second input terminal of the respective multiplying circuits $7_0-7_N$, whilst these signals are also coupled to a first input of respective multipliers $9_0-9_N$, whose respective second inputs are connected to a coefficient register, not shown, which can produce coefficients $C_{00}-C_{0N}$.

The output signal of the multipliers $7_0-7_N$ is coupled to the respective first inputs of multipliers $8_0-8_N$ whose respective second inputs are coupled to a coefficient register, also not shown, which can produce the coefficients $C_{s0}-C_{sN}$.

The outputs of the multipliers $9_0-9_N$ are connected to the outputs of the corresponding multipliers $8_0-8_N$ and these combined output signals are coupled to the inputs 0–N of a summing circuit 10 whose output produces a linear approximation $\hat{e}$ of the echo cancellation signal.

The mode of operation of the transversal filter of FIG. 1 is the same for each of the N+1 stages and will now be described for stage i.

Transmit symbol=0 signal q=1;
signal r=1 or 0 (indefinite).

The signal $t_i$ of switch $5_i$ is −1 or +1 and the output signal of inverter $6_i=0$, so that the output signal of multiplier $7_i$ is equal to 0 and consequently also the output signal of multiplier $8_i$. The coefficient $C_{si}$ therefore does not contribute towards the echo cancellation signal $\hat{e}$.

In multiplier $9_i$ the signal q(a logic 1) is multiplied by the coefficient $C_{0i}$, so that the $i^{th}$ transmit symbol, having a zero level contributes towards the echo cancellation signal which is determined by the zero level coefficient $C_{0i}$, which coefficient also has a relatively low value which in any case is significantly smaller than the transmit signal level amplitude since the zero level to be cancelled is only determined by shifting the zero level between transmission and receiving the transmit signal having the zero level again via the echo path. This shift can be produced either by a symmetry in the transmit amplifier, which determines the transmit levels from the signals p and m, or by offset voltages in the hybrid circuit which couples the transmit amplifier to the two-wire connection via which the transmission is effected. As the coefficient $C_{0i}$ need only be capable of assuming a comparatively low value the storage capacity for the register of the coefficients $C_0$ can be small and only a very small chip surface area must be reserved for this purpose.

Transmit symbol=+1 signal q=0;
signal r=1.

In this case the coefficient $C_{0i}$ does not contribute towards the echo cancellation signal as a logic 0 is applied to the first input terminal of multiplier $9_i$.

The output signal of inverter $6_i$ is a logic 1, so that the input signal of amplifier 7, which in this case is the signal level +1, is multiplied in multiplier $7_i$ by a logic 1 and thereafter in multiplier $8_i$ by the coefficient $C_{si}$, in order to determine the echo cancellation component for the signal i having the level +1. The register containing the coefficients $C_{si}$ must have such a storage capacity that the coefficients can assume the full value of the signal level amplitude.

Transmit symbol=−1 signal q=0;
signal r=0.

For this case the operation is equal to the above-described operation for a transmit signal=+1. With exception of the fact that the signal $t_i$ applied to multiplier $7_i$ is a signal having the −1 level, which signal having the −1 level is multiplied in multiplier $8_i$ by the coefficient $C_{si}$.

As the transmit signals having the levels +1 and −1 are compensated in the above-described manner with a similar coefficient $C_{si}$, whilst simultaneously the zero level is shifted such with the aid of the coefficient $C_{0i}$ that the received transmit level +1 and the received transmit level −1 are located symmetrically relative to this zero level, an optimum cancellation of the two transmit signal levels is possible, in spite of the asymmetry therein, using one coefficient register in which the coefficients must be capable of assuming the full transmit signal amplitude and one coefficient register in which the coefficients need to be capable of passing only through a relatively narrow amplitude range.

Figure 2:
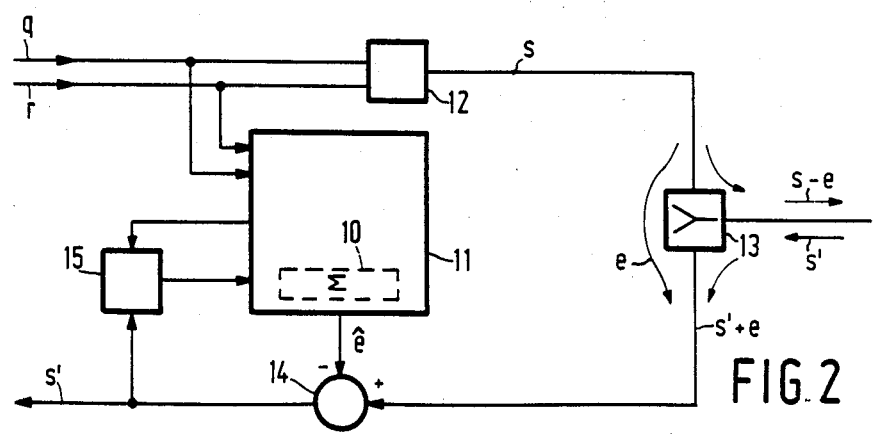
FIG. 2 shows a block circuit diagram of a portion of a transceiving system in which the filter of FIG. 1 is incorporated.

FIG. 2 shows in what way the adaptive transversal filter according to the invention can be incorporated in a schematically shown transceiver system.

An input signal is applied via input terminals to the filter 11 and also to a transmit amplifier 12 which converts the signal into transmit symbols s. The input signal may consist of the above-described binary signals p and m which are then converted into transmit symbols in accordance with Table 1 by amplifier 12. It is however alternatively possible to apply to the input terminals the signals q and r which already contain the information derived in the circuit of FIG. 1 from the input signal by the logic circuits 1 and 3. It will be obvious that amplifier 12 should then convert the signals q and r into transmit symbols in a different manner. The system is arranged for communication via a two-wire line, for which purpose a hybrid circuit 13 is provided for a most adequate separation between the received and transmitted signal. Also with a properly designed hybrid circuit a significant portion e of the signal transmitted by amplifier 12 will still reach the receive circuit via the hybrid circuit and be applied together with the received signal s' to one input of the subtracting circuit 14. In the subtracting circuit 14 the signal s'+e is reduced by the echo cancellation signal ê, which is the best possible linear approximation of the echo signal. Acting thus, only the signal s' is actually present at the output of circuit 14 from where it can be applied to a receiver which is known per se and is not shown further. Since, according to the invention, when combining the signal s'+e and the signal ê in subtracting circuit 14 a zero level shift is produced, such a zero level shift will also be present in the signal s'. Such a zero level shift however is objectionable and can, for example, be offset by having the signal s' pass a high-pass filter before it is applied to the receiver.

Finally, the system shown in FIG. 2 includes a circuit 15 which on the basis of the coefficients used for forming the echo cancellation signal and the signal s' determines new coefficients and enters them into the coefficient registers in the filter 11. Consequently the circuit 15 constitutes the adaptive control for optimizing the coefficients $C_{0i}$ and $C_{si}$ in known manner.

The adaptive control for optimizing the coefficients $C_{0i}$ and $C_{si}$ has a high convergence rate, that is to say that it results faster in an optimum compensation signal, since the amplitude range of the coefficients $C_{0i}$ is low the optimum coefficient values are reached fast, as furthermore the register containing the coefficients $C_{si}$ is always addressed when the transmit level is unequal to the zero level, the coefficient values $C_{si}$ are addressed and consequently optimized twice as often as in the case of a filter structure having separate coefficient registers for the +1 level and for the −1 level.

What is claimed is:

1. An adaptive transversal filter having an input for receiving a time-discrete input signal which is representative of three signal levels constituting a central signal level and two extreme signal levels, first and second delay means responsive to said signal levels applied to said input for producing delayed versions of each time-discrete input signal, first and second coefficient registers each containing respective coefficients for the nondelayed and each delayed version of the input signal, individual coefficients in said first and second registers being respectively associated with signals in said first and second delay means; means responsive to said registers and to said first and second delay means for multiplying one of the coefficients by the associated version of the input signal, and means for adding together all the multiplying results obtained to provide a cancellation signal, characterized in that the first delay means contains M delayed versions of each time-discrete signal and the first coefficient register contains M+1 coefficients, that the second delay means contains N delayed versions of each time-discrete signal and the second coefficient register contains N+1 coefficients, wherein $M \leq N$ and that when information representing the central signal level is applied to the first delay means, that information representing one or the other extreme signal level is correspondingly applied to the second delay means, in addition means being provided for only applying multiplication results obtained with the air of the first delay means to said adding means when the information present which signals the presence of the central signal level is applied to the first delay means.

2. A transversal filter as claimed in claim 1, characterized in that the information applied to the first and second delay means, respectively, is binary information and that the means for only applying to said adding means the multiplication results obtained with the aid of the first delay means is arranged to always block the multiplication results obtained with the aid of the second delay means when the corresponding signal of the first delay means contains the information indicating the presence of the central signal level.

3. A transversal filter as claimed in claim 2, the first and second delay means being shift registers comprising an equal number of sections each having N terminals, that the means for only applying to said adding means the multiplication results obtained with the aid of the first delay means include an inverter and an associated multiplying circuit for each pair of corresponding terminals of the first and second delay means, the input of each inverter being connected to a respective one of the N terminals of the first delay means, a first input of each associated multiplying circuit being connected to a respective corresponding one of the N terminals of the second delay means, a second input of each multiplying circuit being connected to the output of the associated inverter and the output of the multiplying circuit being connected to the means for multiplying the signal from the second delay means by its associated coefficient.

4. A transversal filter as claimed in claim 3, characterized in that the transversal filter includes N+1 switching members, that the binary signal at an input and at each of the terminals of the second delay means is a control signal for a respective one of the N+1 switching members, the binary signal at said input and at each of the terminals of the second delay means controlling the respective switching members at a first binary value such that a given positive transmit signal level is connected to the first input of the respective multiplying circuit and such that a given negative transmit signal level is connected to the first input of the respective multiplying circuit at the other binary value.

5. A transversal filter as claimed in claim 1 or 2, characterized in that M=N and that in the first coefficient register the coefficients P up to and including N+1 are equal to zero, wherein P<N.

* * * * *

UNITED STATES PATENT AND TRADEMARK OFFICE
CERTIFICATE OF CORRECTION

PATENT NO. : 4,786,884

DATED : November 22, 1988

INVENTOR(S) : Simon J. M. Tol and Kornelis J. Wouda

It is certified that error appears in the above-identified patent and that said Letters Patent is hereby corrected as shown below:

In the Claims:

In Column 8, Line 3, "air" should read --aid--.

Signed and Sealed this

Fifteenth Day of August, 1989

Attest:

DONALD J. QUIGG

*Attesting Officer*    *Commissioner of Patents and Trademarks*